(12) United States Patent
Pasha

(10) Patent No.: US 11,742,801 B2
(45) Date of Patent: Aug. 29, 2023

(54) TRAVELING WAVE MIXER

(71) Applicant: Keysight Technologies, Inc., Santa Rosa, CA (US)

(72) Inventor: Rizwan Pasha, Centennial, CO (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 0 days.

(21) Appl. No.: 17/878,244

(22) Filed: Aug. 1, 2022

(65) Prior Publication Data

US 2023/0140378 A1    May 4, 2023

Related U.S. Application Data

(60) Provisional application No. 63/273,381, filed on Oct. 29, 2021.

(51) Int. Cl.
*H03D 7/14*     (2006.01)
*H03D 7/12*     (2006.01)
*H03F 3/58*     (2006.01)

(52) U.S. Cl.
CPC ............ *H03D 7/12* (2013.01); *H03D 7/14* (2013.01); *H03F 3/58* (2013.01)

(58) Field of Classification Search
CPC .......... H03D 7/12; H03D 7/14; H03D 7/1425; H03D 7/1433; H03D 7/1441;
(Continued)

(56) References Cited

U.S. PATENT DOCUMENTS

| 8,351,891 B2 | 1/2013 | Heydari et al. |
| 9,024,703 B2 * | 5/2015 | Ferndahl ................. H03F 3/602 327/327 |

(Continued)

FOREIGN PATENT DOCUMENTS

JP    2012227739 A    11/2012

OTHER PUBLICATIONS

Ehsan Ehsaeyan, "Design of a Broadband HEMT Mixer for UWB Applications," Indian Journal of Science and Technology, vol. 9(26), Jul. 2016, pp. 1-5.

*Primary Examiner* — Long Nguyen

(57) ABSTRACT

A travelling wave mixer (TWM) is provided that includes an input artificial transmission line configured to transmit an input signal, an output artificial transmission line configured to transmit an output signal, a local oscillator (LO) artificial transmission line configured to transmit an LO signal, and a plurality of mixer stages connected in parallel between the output artificial transmission and the input artificial transmission line. Each of the mixer stages includes an input amplifier, a mixer and an output amplifier connected in series between the input artificial transmission line and the output artificial transmission line, where an input of the mixer receives an output of the input amplifier, and an output of the mixer is applied to an input of the output amplifier. Further, each of the mixer stages includes a phase-adjustable LO amplifier circuit connected between the LO artificial transmission line and an LO input of the mixer, where the phase-adjustable LO amplifier is configured to adjust an LO signal phase applied to the LO input of each mixer to null out a phase error in each mixer stage independently.

20 Claims, 10 Drawing Sheets

600

(58) Field of Classification Search
CPC .. H03D 7/1458; H03D 7/1466; H03D 7/1483; H03D 7/16; H03D 7/161; H03D 7/163; H03D 7/165; H03F 3/58
See application file for complete search history.

(56) References Cited

U.S. PATENT DOCUMENTS

| | | |
|---|---|---|
| 9,306,499 B2 | 4/2016 | Griggs |
| 2015/0091632 A1* | 4/2015 | Griggs ................... H03F 3/191 327/356 |

* cited by examiner

TRAVELING WAVE MIXER

CROSS-REFERENCE TO RELATED APPLICATIONS

The present application claims priority under 35 U.S.C. § 119(e) to U.S. Provisional Application No. 63/273,381 filed on Oct. 29, 2021. The entire disclosure of U.S. Provisional Application No. 63/273,381 is specifically incorporated herein by reference in its entirety.

BACKGROUND

Mixers and IQ mixers are fundamental circuits in communication applications. The performance specifications/parameters of these mixers can be a limiting factor in the performance of the end system. Several parameters determine the overall performance of a mixer. These parameters include Conversion Gain vs Frequency, Noise Figure (NF), Linearity/Distortion (Third Order Intercept—TOI/IP3), Dynamic Range (IP3 minus NF), LO Even Harmonic Suppression to avoid in band spurs (2LO+/−IF, 2LO+/−2IF, 4LO+/−IF etc.), LO Feed Thru, IF Feed Thru, and Sideband suppression/Image Rejection. The last five of these parameters are considered analog impairments that degrade the performance of the mixers.

System designers are always trying to design for high frequency performance while maximizing the gain and dynamic range of the system and maintaining high performance for the parameters listed above. Typically, the high frequency design requirements result in many of these parameters to be compromised. Diode based mixers offer high dynamic range compared to Gilbert Cell mixers but suffer from poor conversion gain. Gilbert Cell mixers offer higher conversion gain at the expense of degraded dynamic range. A Travelling Wave Mixer (TWM) circuit extends the high frequency performance of Gilbert Cell mixers while providing high gain and improving SNR (or dynamic range) through analog impairment correction.

FIGS. 1A and 1B are simplified circuit diagrams of a Gilbert Cell mixer and a Gilbert Cell based IQ mixer.

Referring to FIG. 1, the Gilbert Cell mixer includes a transconductance (Gm) stage containing transistors Q1 and Q2, and a switching stage (Mixer) containing transistors Q3, Q4, Q5 and Q6. Intermediate frequency input signal (IF In) is fed to the Gm stage, while the switching stage perform RF voltage-to-current conversion and switches the polarity of the RF inputs at the local oscillator (LO) frequency rate to generate an RF frequency output signal (RF Out). Also shown in the figures are resistive elements RE of the Gm stage coupled to a source of bias current, and load resistances RL.

In traditional wide bandwidth single stage Gilbert Cell mixer shown in FIG. 1A, increasing the gain and decreasing the noise requires decreasing the resistor RE. However, a drawback of decreasing RE is that the linearity degrades of the Gm stage (Q1 & Q2) and the Gilbert Cell transistors (Q3, Q4, Q5, Q6) (in other words the distortion increases). To compensate for this degradation in linearity, the bias current in the mixer must be increased. As a result, transistor sizes must be increased to handle the increase in the bias current. Increase in transistor size results in higher parasitic capacitance for each transistor, thus limiting the maximum achievable bandwidth for the mixer at the IF input, LO input, and RF output of the mixer. Thus, the performance of the circuit is limited in terms of gain, noise, linearity, and maximum operating frequency.

In an effort to improve gain and bandwidth, an amplifier may be added to the output of the mixer of FIG. 1A. The mixer itself is biased at lower currents with a higher RE and smaller transistors. As a result, the mixer can achieve high frequency performance due to lower parasitic capacitances, while the amplifier on the output of the mixer provides the necessary gain. However, the larger RE in the mixer results in a higher noise figure and hence a lower dynamic range. In addition, the amplifier on the output of the mixer will degrade the linearity and noise of the combined mixer and amplifier circuits.

Referring to FIG. 1B, the Gilbert Cell based IQ mixer is characterized by two Gilbert Cell mixers (I-Mixer and Q-mixer) in parallel, with the LO signal phase of the Q-mixer being shifted in phase by 90° relative to the LO signal phase of the I-mixer. While IQ mixer circuit of FIG. 1b achieves higher gain with two mixers in parallel. However, the bandwidth is limited due to the higher parasitic capacitance on the IF input, LO input, and RF output nodes. IQ mixer circuit topology of FIG. 1B suffers the same limitations as described for a Gilbert Cell Mixer described above.

SUMMARY

According to an aspect of the inventive concepts, a travelling wave mixer (TWM) is provided that includes an input artificial transmission line configured to transmit an input signal, an output artificial transmission line configured to transmit an output signal, a local oscillator (LO) artificial transmission line configured to transmit an LO signal, and a plurality of mixer stages connected in parallel between the output artificial transmission and the input artificial transmission line. Each of the mixer stages includes an input amplifier, a mixer and an output amplifier connected in series between the input artificial transmission line and the output artificial transmission line, where an input of the mixer receives an output of the input amplifier, and an output of the mixer is applied to an input of the output amplifier. Further, each of the mixer stages includes a phase-adjustable LO amplifier circuit connected between the LO artificial transmission line and an LO input of the mixer, where the phase-adjustable LO amplifier is configured to adjust an LO signal phase applied to the LO input of each mixer to null out a phase error in each mixer stage independently.

The phase error in each mixer stage nulled out by the phase-adjustable LO amplifier may be a phase error in the signal path from the LO artificial transmission line to the output of the mixer in each stage.

The phase error in each mixer stage nulled out by the phase-adjustable LO amplifier may be a phase error of an upper side band signal or a lower side band signal at the output of the mixer in each stage.

The input signal may includes a range of frequencies, and the phase error in each mixer stage nulled out by the phase-adjustable LO amplifier may be one half a difference between a maximum phase error and a minimum phase error in an upper side band signal or a lower side band signal at the output of the mixer in each stage.

The phase-adjustable LO amplifier may be configured to adjust a duty cycle of the LO signal applied to the LO input of the mixer. The duty cycle may be adjusted to 50%.

The phase-adjustable LO amplifier may be configured as an isolation element which inhibits input and output signals of the mixer of each mixer stage from coupling back to the LO artificial transmission line.

The phase-adjustable LO amplifier may be configured to minimize a capacitance on the LO artificial transmission line and maximize a voltage swing delivered to the mixer of each mixer stage.

The input amplifier of each mixer stage may be a transconductance amplifier.

The output amplifier of each mixer stage may be a cascode amplifier.

The input, output and LO artificial transmission lines may be implemented with inductors.

The input, output and LO artificial transmission lines may be implemented with high-impedance transmission line sections.

The TWM may further include at least one feed forward mixer correction stage connected in parallel between the input transmission line and the output transmission line. Each feed forward mixer correction stage may include an amplifier and a mixer connected in series between the input transmission line and the output transmission line, where an input of the mixer receives an output of the input amplifier, and an output of the mixer is applied to an input of the output amplifier. Each feed forward mixer correction stage may further include a phase-adjustable LO amplifier circuit connected between the LO transmission line and an LO input of the mixer, the phase-adjustable LO amplifier configured to adjust an LO signal phase applied to the LO input of each mixer to null out a phase error in each feed forward mixer correction stage independently.

The TWM may further include at least analog impairment correction stage connected in parallel between the input transmission line and the output transmission line. Each analog impairment correction stage may include an input amplifier, a mixer and an output amplifier connected in series between the input transmission line and the output transmission line, where an input of the mixer receives an output of the amplifier, and an output of the mixer is applied to an input of the output amplifier. Each feed forward mixer correction stage may further include a phase-adjustable LO amplifier circuit connected between the LO artificial transmission line and an LO input of the mixer, the phase-adjustable LO amplifier configured to adjust an LO signal phase applied to the LO input of each mixer to null out a phase error in each feed forward mixer correction stage independently.

According another aspect of the inventive concepts, a travelling wave IQ-mixer (TWM-IQ) is provided that includes first and second artificial input transmission lines each configured to transmit an input signal, an output artificial transmission line configured to transmit an output signal, first and second artificial local oscillator (LO) transmission line each configured to transmit an LO signal, a first plurality of mixer stages connected in parallel between the output artificial transmission line and the first input artificial transmission line, and a second plurality of mixer stages connected in parallel between the output artificial transmission line and the second input artificial transmission line. Each of the first mixer stages includes an input amplifier, a mixer and an output amplifier connected in series between the first input artificial transmission line and the output artificial transmission line, where an input of the mixer receives an output of the amplifier, and an output of the mixer is applied to an input of the output amplifier. Each of the first mixer stages further includes a phase-adjustable LO amplifier circuit connected between the first LO artificial transmission line and an LO input of the mixer, the phase-adjustable LO amplifier configured to adjust an LO signal phase applied to the LO input of each mixer to null out a phase error in each first mixer stage independently. Each of the second mixer stages includes an input amplifier, a mixer and an output amplifier connected in series between the second input artificial transmission line and the output artificial transmission line, where an input of the mixer receives an output of the input amplifier, and an output of the mixer is applied to an input of the output amplifier. Each of the second mixer stages further includes a phase-adjustable LO amplifier circuit connected between the second LO artificial transmission line and an LO input of the mixer, the phase-adjustable LO amplifier configured to adjust an LO signal phase applied to the LO input of each mixer to null out a phase error in each second mixer stage independently.

The phase error in each mixer stage nulled out by the phase-adjustable LO amplifier may be a phase error in the signal path from the LO artificial transmission line to the output of the mixer in each stage.

The phase error in each mixer stage nulled out by the phase-adjustable LO amplifier may be a phase error of an upper side band signal or a lower side band signal at the output of the mixer in each stage.

The input signal may includes a range of frequencies, and the phase error in each mixer stage nulled out by the phase-adjustable LO amplifier may be one half a difference between a maximum phase error and a minimum phase error in an upper side band signal or a lower side band signal at the output of the mixer in each stage.

BRIEF DESCRIPTION OF THE DRAWINGS

The above and other aspects and features of the inventive concepts will become readily apparent from the detailed description that follows, with reference to the accompanying drawings, in which.

DETAILED DESCRIPTION

Figures 1A, 1B:
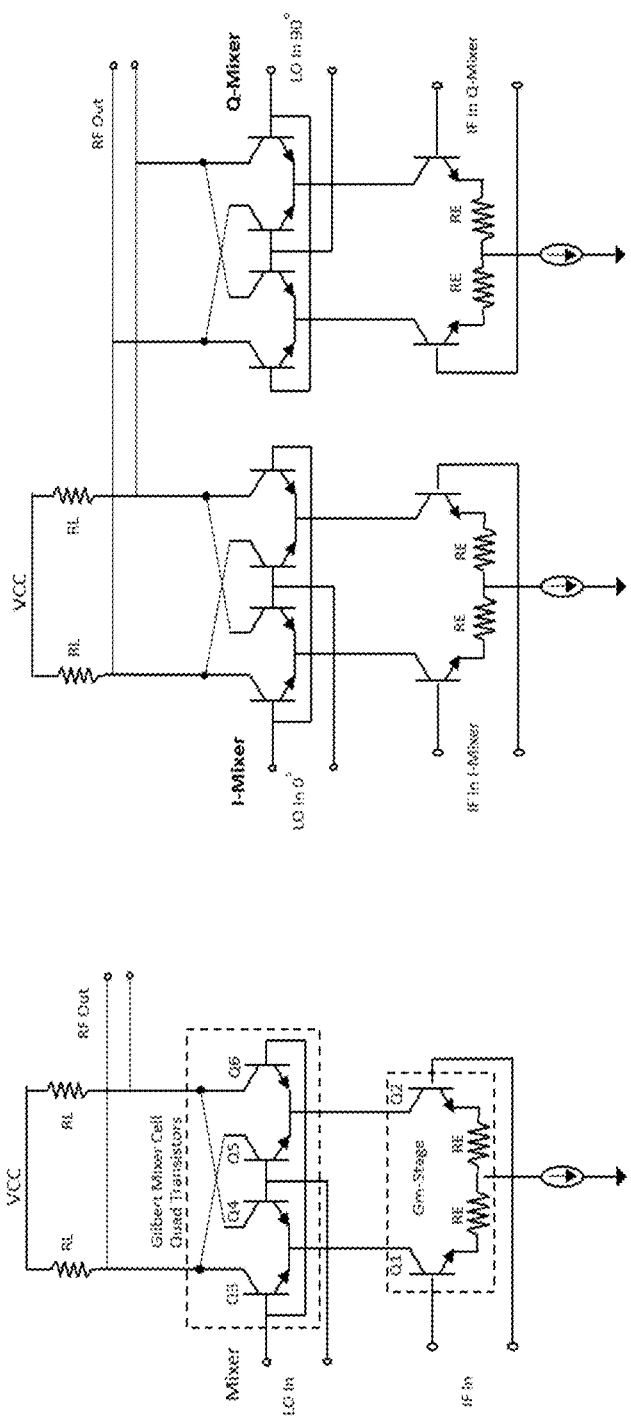
FIGS. 1A and 1B are respective circuit diagrams of a Gilbert Cell mixer and Gilbert Cell based IQ mixer of the related art.

Throughout the drawings, like reference numbers are given to like elements in the various embodiments. In addition, as the discussion below progresses from one embodiment to the next, a detailed description of already described elements common to previous embodiments is not repeated to avoid redundancy.

As is traditional in the field of the present disclosure, embodiments may be described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

Figure 2:
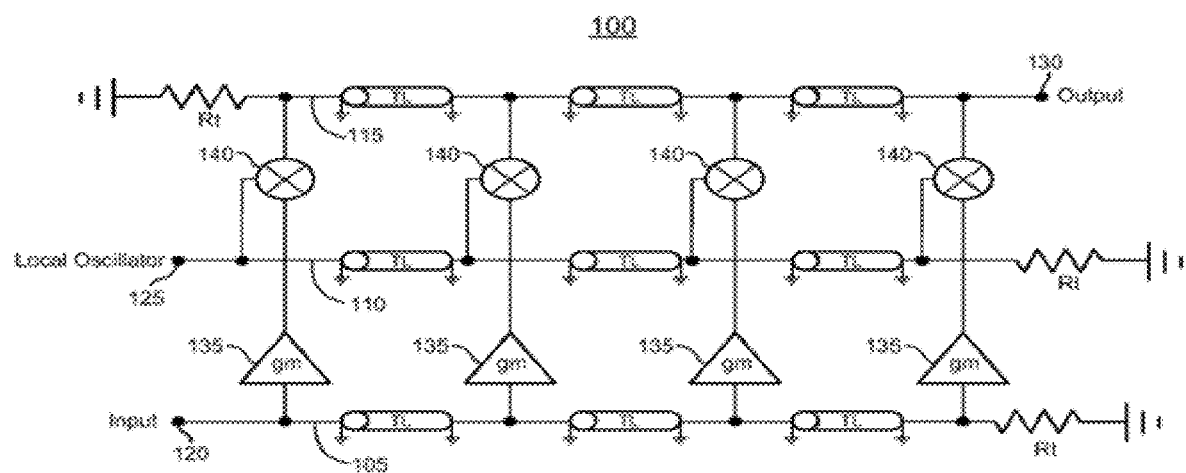
FIG. 2 is a circuit diagram of a traveling wave mixer (TWM) of the related art.

FIG. 2 is a circuit diagram of a traveling wave mixer (TWM) of the related art. This TWM is described in U.S. Pat. No. 9,306,499 ("the '499 patent"), issued Apr. 5, 2016, the disclosure of which is incorporated by reference herein in its entirety.

Briefly, referring to FIG. 2, the TWM 100 includes a first transmission line 105 ("input transmission line"), a second transmission line 115 ("Output transmission line"), a plurality of A/M stages arranged in parallel between first and second transmission lines 105 and 115, and a third transmission line 110 ("LO transmission line"). The first through third transmission lines each include a plurality of transmission line elements, labeled "TL". Each of the transmission line elements comprises a smaller transmission line and has a characteristic delay. Each of the A/M stages comprises a transconductance (gm) amplifier 135 arranged in series with a mixer 140. During typical operation, the input signal is supplied to input port 120 of first transmission line 105. As the input signal propagates down first transmission line 105, the individual A/M stages respond by inducing an amplified and frequency translated complementary forward traveling wave on second transmission line 115. First and second transmission lines 105 and 115 are typically designed such that their transmission line elements produce substantially equal delay, which results in the respective outputs of the individual A/M stages summing in phase. The design of transmission line elements with substantially equal delays can be accomplished through proper selection of propagation constants and lengths of the two lines. The overall gain of traveling wave mixer 100 is generally a linear function of the number of A/M stages, exhibiting an additive gain with an increasing number of stages. More specifically, traveling wave mixer 100 exhibits an additive gain with an increasing number of stages. This additive gain, coupled with the distribution of parasitics across the transmission lines, enables traveling wave mixer 100 to achieve an increased gain-bandwidth product while maintaining a desired SNR.

Figure 3A:
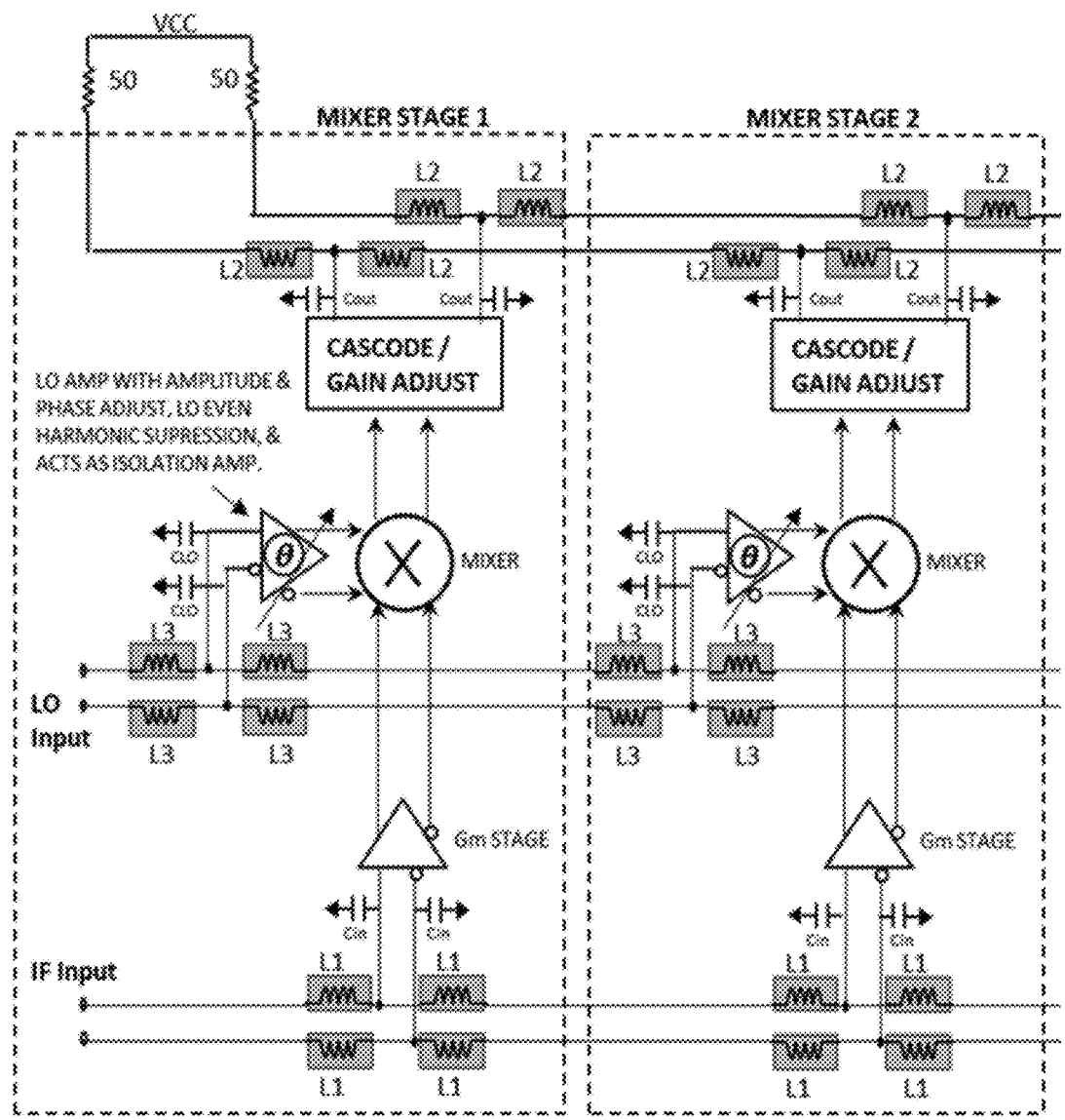
FIGS. 3A and 3B are a circuit diagram of a TWM according to embodiments of the inventive concepts.
Figure 3B:
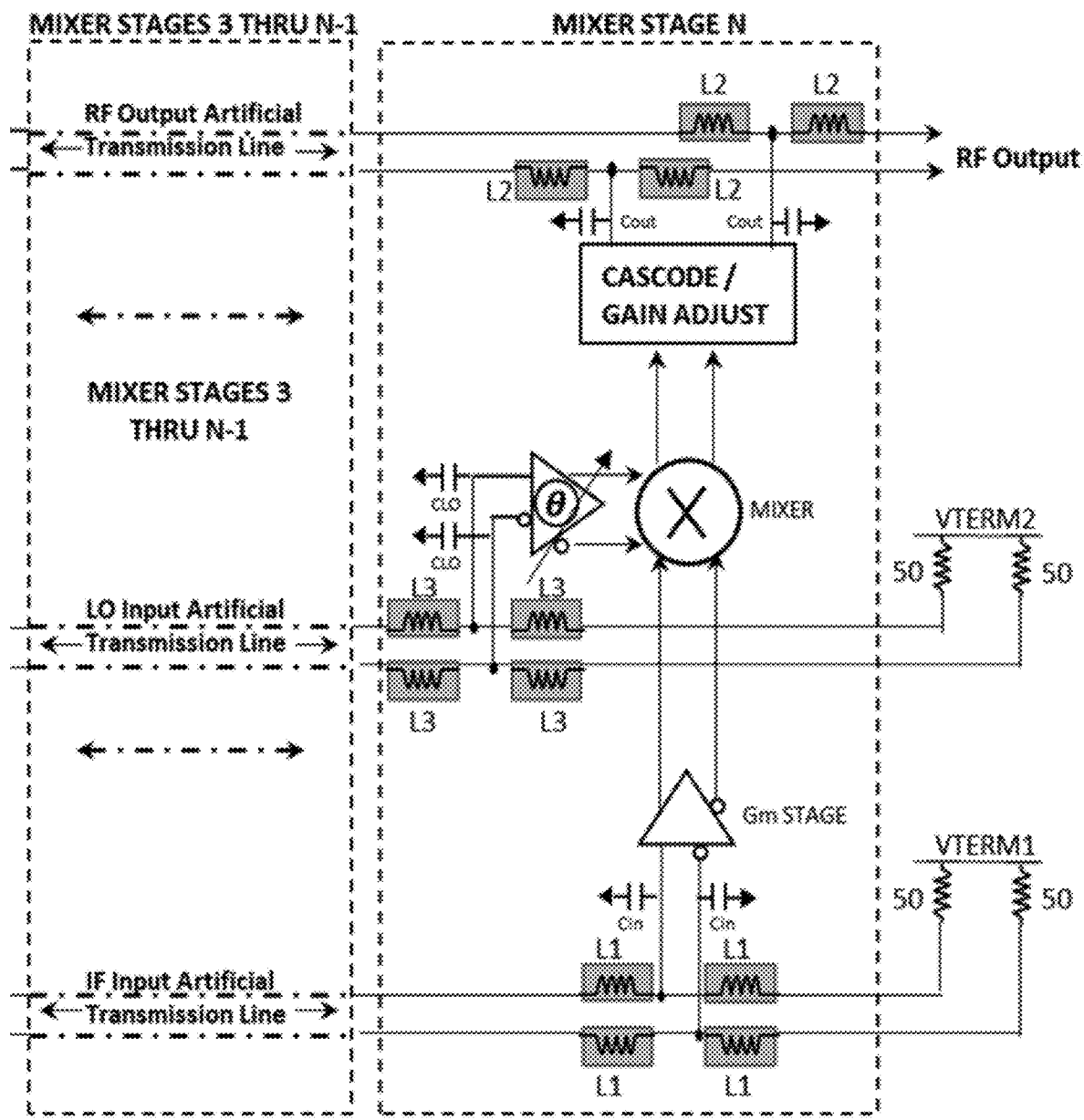

FIGS. 3A and 3B collectively constitute a circuit diagram of a traveling wave mixer (TWM) according to an embodiment of the inventive concepts. As will be apparent, the right side of the circuit shown in FIG. 3A is coupled to the left side of the circuit of FIG. 3B to form a TWM of the embodiment.

Referring to FIGS. 3A and 3B, the TWM 300 includes N mixer stages, where N is an integer of at least 2, connected in parallel between an input transmission line (IF Input) and an output transmission line (RF Output). Each mixer stage includes an input amplifier (Gm Stage), and mixer, and an output amplifier (cascade/gain adjust). Each mixer combines a signal on the input transmission line and a local oscillating (LO) on an LO transmission line (LO Input). The mixers of the N mixer stages may be Gilbert Cell based mixers.

Further, as will be explained in detail below, each mixer stage further includes a phase-adjustable LO amplifier circuit (LO AMP) connected between the LO transmission line and an LO input of the mixer, where the phase-adjustable LO amplifier is configured to adjust an LO signal phase applied to the LO input of each mixer to null out a phase error in each mixer stage independently.

The embodiment of FIGS. 3A and 3B includes several (N) stages of mixers in parallel whose IF inputs are all connected, for example, via an input 50-ohm (see VTERM1) artificial transmission line and whose RF outputs are all connected, for example, via an output 50-ohm (see VCC) artificial transmission line. In the current embodiment, artificial transmission lines are implemented with inductors L1, L2 and L3 to compensate the input and output parasitic capacitance Cin, Cout of the mixer stages. The LO inputs of the Mixer stages are all connected via an input 50-ohm (see VTERM2) artificial transmission line. In the figures, CLO denotes the parasitic capacitances at the LO transmission line. The TWM is thus designed with three artificial transmission line structures that connect the LO, IF, and RF signals to the parallel mixer stages that constitute the TWM.

Zin=$\sqrt{L1/Cin}$; Zin & L1 are impedance and inductance of IF input artificial transmission line, Cin is input parasitic capacitance.

ZLO=$\sqrt{L3/CLO}$; ZLO & L3 are impedance and inductance of LO input artificial transmission line, CLO is input parasitic capacitance.

Zout=$\sqrt{L2/Cout}$; Zout & L2 are impedance and inductance of RF output artificial transmission line, Cout is input parasitic capacitance.

In addition, the propagation delay along each of these transmission lines may be specified as:

$TPD_{IN}=\sqrt{L1*Cin}$; propagation delay along IF input transmission line.

$TPD_{LO}=\sqrt{L3*CLO}$; propagation delay along LO input transmission line.

$TPD_{OUT}=\sqrt{L2*Cout}$; propagation delay along RF output transmission line.

As mentioned above, each mixer stage consists of an amplifier referred to herein as an "Lo amplifier" or "LO Amp" that is designed to drive the transistors that implements the function of, for example, a Gilbert Cell mixer. The LO Amp is designed to serve the following functions:

LO Amp is designed and optimized to drive the capacitance of the Mixer transistors for high frequency performance.

LO Amp presents a low capacitance to the artificial transmission line for the LO signal. This is important to achieve high bandwidth on the LO artificial transmission line as per the equation: f−3 dB=$1/(2\pi\sqrt{LC})$.

LO Amp implements phase adjustment LO phase adjust capability to null out the phase error in each TWM stage. This phase adjustment capability is critical to null out the phase error in the signal path from LO input to Mixer output and from data input to Mixer output for each Mixer stage. The phase error nulling is described in more detail in the next section.

LO Amp includes an analog input to correct the duty cycle of the LO to 50% so that even harmonics of the LO (2LO, 4LO, etc.,) can be suppressed and this results in a suppression of unwanted mixer products generated from even LO harmonics mixing with the IF input (2LO+/−IF, 2LO+/−2IF, etc.,).

The limiting amplifier acts as an isolation buffer to prevent the Mixer input and output signals from coupling back into the LO T-Line structure that can couple into other Mixer stages thus causing self-mixing which creates un-wanted mixing products.

The LO Amp phase adjust feature is used to cancel the phase error for the following two cases:

Phase error in LO to Mixer output signal path in each stage can be corrected.

Phase error in IF input signal path to mixer output (phase error in IF input and RF output between mixer stages) for a desired sideband (upper or lower) can be reduced in half as explained below:

Effect of Time Delay/Phase adjustment in LO signal path: Let "$t_0$" be the time delay adjustment in the LO signal path for a given mixer stage.

$$\text{Vout\_Mixer} = \cos[\omega_{LO}(t-t_0)] * \cos[\omega_{IF}t] =$$
$$0.5 * [\cos((\omega_{LO}t - \omega_{LO}t_0) - \omega_{IF}t) + \cos((\omega_{LO}t - \omega_{LO}t_0) + \omega_{IF}t)] =$$
$$0.5 * [\cos((\omega_{LO} - \omega_{IF})t - \omega_{LO}t_0) + \cos((\omega_{LO} + \omega_{IF})t - \omega_{LO}t_0)]$$

It can be seen in the above equation that a time delay adjustment in the LO signal path applies a static phase offset "$\omega_{LO}t_0$" to all frequencies at the output of the mixer. This allows us to cancel any time delay errors in the LO signal path for each mixer. This feature relaxes the requirement to match the time delay in the LO signal path to time delay in the IF and RF signal paths.

Effect of Time Delay mismatch in IF input signal path: Let "$t_1$" be the time delay mismatch error in the IF signal path for a given mixer stage.

$$\text{Vout\_Mixer} = \cos[\omega_{LO}t] * \cos[\omega_{IF}(t-t_1)] =$$
$$0.5 * [\cos(\omega_{LO}t - (\omega_{IF}t - \omega_{IF}t_1)) + \cos(\omega_{LO}t + (\omega_{IF}t - \omega_{IF}t_1))] =$$
$$0.5 * [\cos((\omega_{LO} - \omega_{IF})t + \omega_{IF}t_1) + \cos((\omega_{LO} + \omega_{IF})t - \omega_{IF}t_1)]$$

It can be seen in the above equation that a time delay mismatch "$t_1$" in the input IF signal path in each mixer results in a phase error "$+\omega_{IF}t_1$" in the lower side band and "$-\omega_{IF}t_1$" that is dependent on the frequency of the IF signal and the time delay $t_1$. This phase error increases linearly with frequency for a fixed time delay error. In addition, the phase error is positive for lower side band and negative for upper side band at the output of the mixer. If the input IF signal has a frequency spectrum between $\omega_{IF1}$ and $\omega_{IF2}$, then the output of the mixer will exhibit a phase error that increases linearly with frequency between $\omega_{IF1}$ and $\omega_{IF2}$. The time delay adjustment in the LO signal path can be used to reduce the phase error in the upper or lower side band for each mixer by half by canceling the phase at the center of the desired frequency band. This technique to correct the phase error works very well in Image Reject Mixers or Single Side Band generators since only one side band is generated and the other is suppressed and the phase error in the desired side band can be corrected by half. Hence this technique relaxes the requirement to match the time delay in the IF and RF signal paths.

Separately, it is noted that the cascode amplifier of each stage improves the bandwidth of the LO signal path in each mixer stage by reducing the Miller Capacitance seen by the LO amplifier in each stage. Increasing the bandwidth of the LO signal path in each mixer stage ensures that the LO amplitude delivered to the mixer remains large up to the maximum bandwidth. The large LO amplitude is critical to maintain high linearity in the mixer and to reduce the noise contribution of each mixer stage. The plurality of mixers provides high gain. Thus the TWM configuration enables high gain, linearity, and low noise to the maximum operating frequency.

Figure 4A:
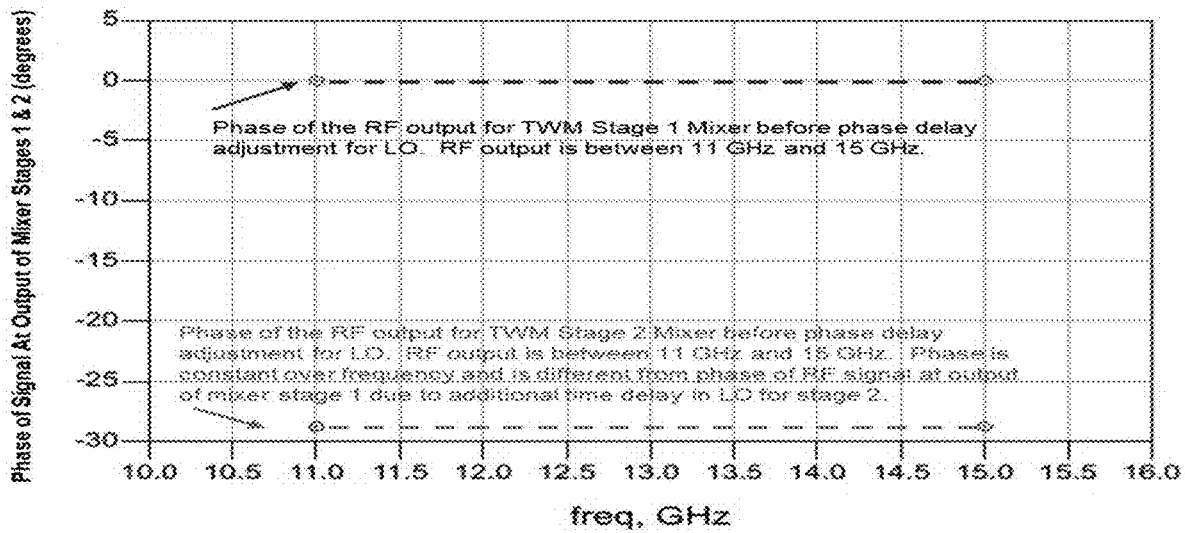
FIGS. 4A, 4B, 5A and 5B are plots for reference in describing the correction of phase errors in the TWM of FIGS. 3A and 3B.
Figure 4B:
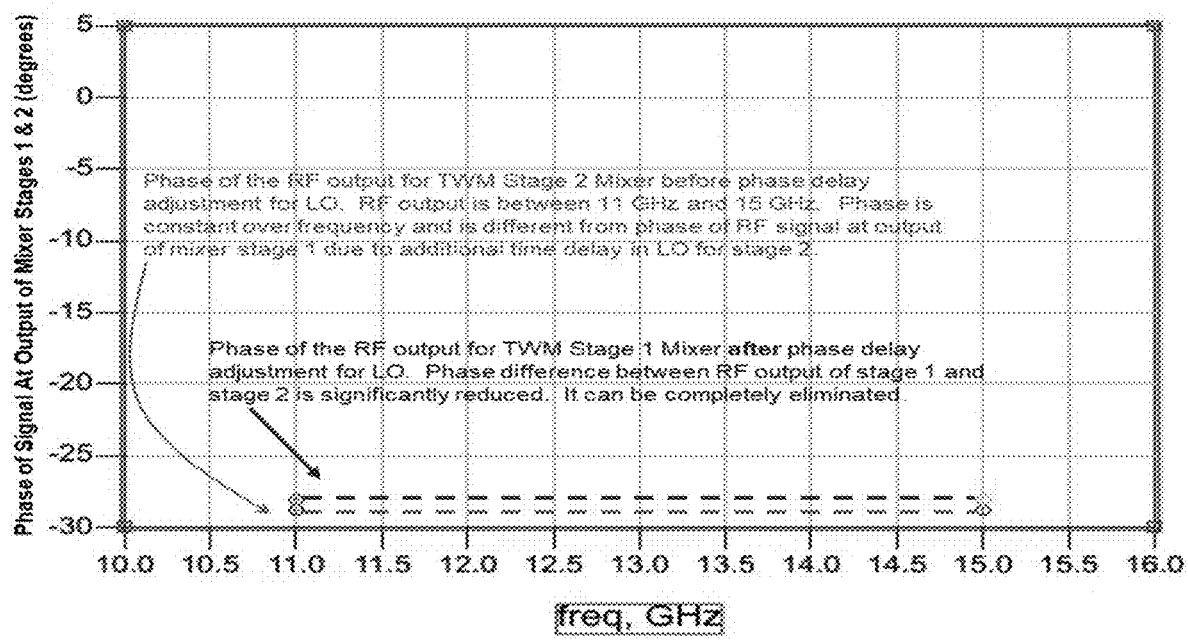

FIG. 4A is an exemplary plot of the phase of an upper side band of the RF signal from stage 1 and stage 2 at the output of the TWM. The IF input signal is between 1 GHz and 5 GHz. The LO signal is at 10 GHz. The RF output signal is at $F_{USB}=F_{LO}+F_F$. The phase of the signal at the summing point at the output of the TWM from stage-1 is 0-deg while the phase from stage 2 is −28 degrees. The additional phase in the RF signal in the output of the stage-2 mixer is due to additional time delay mismatch in the LO signal path for stage-2. The phase difference between stage 1 & stage is 28-degrees. This phase error results in gain reduction at the output of the TWM. This phase error is corrected by adjusting the phase of the LO in the mixer stages as shown in FIG. 4B. Referring to FIG. 4B, shown is the phase of the RF signal at the output of Mixer stages 1 & 2 in a TWM. Phase of LO in mixer stage 1 is adjusted to about −27 degrees. The phase of RF signal at the output of stage 2 is about −28 degrees. The phase difference between stages 1 & 2 is reduced to about 1 degree. This phase difference can be completely zeroed out. The phase difference is not zeroed in the figure for visual purposes.

Figure 5A:
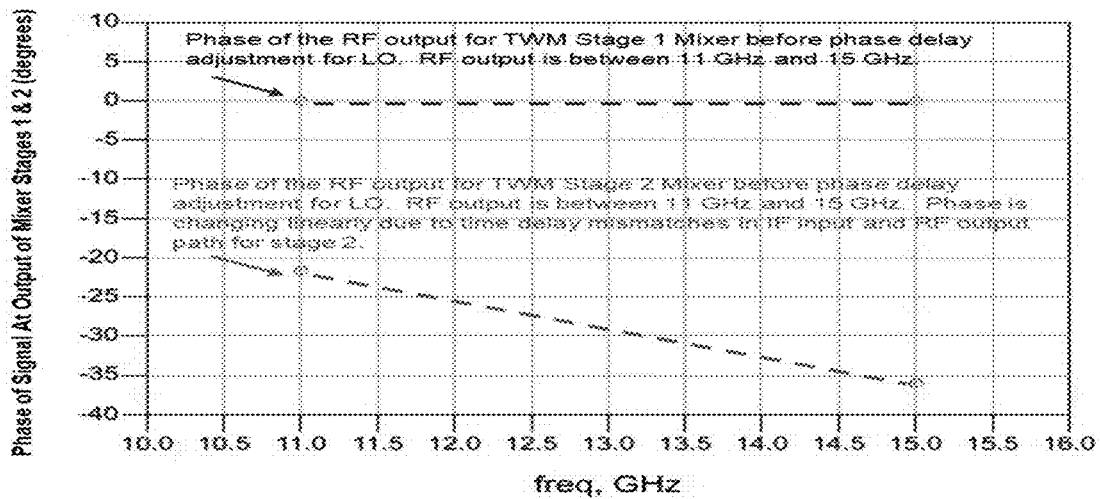
Figure 5B:
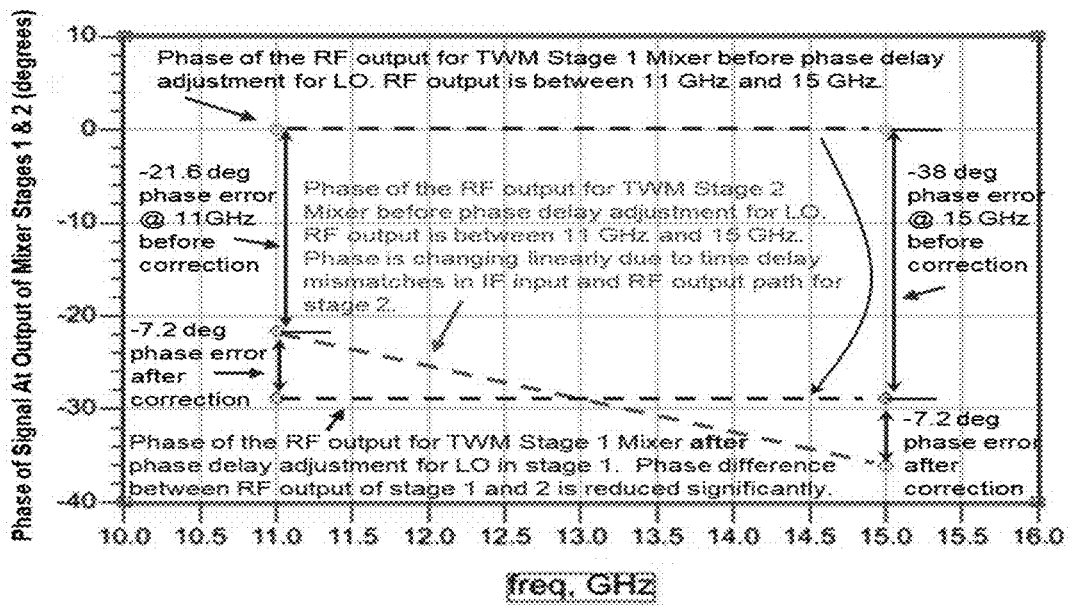

FIGS. 5A and 5B are plots illustrating the manner in which time delay mismatch in the IF input signal path and RF output signal path between mixer stages creates a phase error in the RF signal between the output of the mixer stages. This phase error can be zeroed out at single RF frequency by adjusting the phase of the LO. In the case of a range of RF frequencies at the output of the mixer, the phase errors can be significantly reduced to a value equal to the maximum difference in the phase of the RF signal at the output of any mixer stage divided by 2. It can be seen that the phase of the LO in stage 1 is adjusted until the phase error is canceled at the center frequency of the band at 13 GHz. The phase error is reduced over the entire band from 11 GHz to 15 GHz with the maximum remaining phase error at the edges of the band being equal to the difference between maximum phase error over the frequency band divided by 2. That is, in FIG. 5A, the phase difference in the RF output can be clearly seen between stages 1 & 2. The phase of the RF signal at output of stage 2 increases linearly with frequency since this is caused by additional time delay in the IF input and RF output of stage 2 mixer. FIG. 5B shows that the phase error in the RF signal between stages 1 and 2 is reduced from a maximum of −38 degrees to a maximum of +/−7.2 degrees after correction. The phase error at the center of the RF frequency band at 13 GHz is reduced to zero and increases up to a maximum of +/−7.2 degrees at the edges of the band. The phase error can be calculated by subtracting the flat curve from the inclined curve in FIG. 5B.

Figure 6:
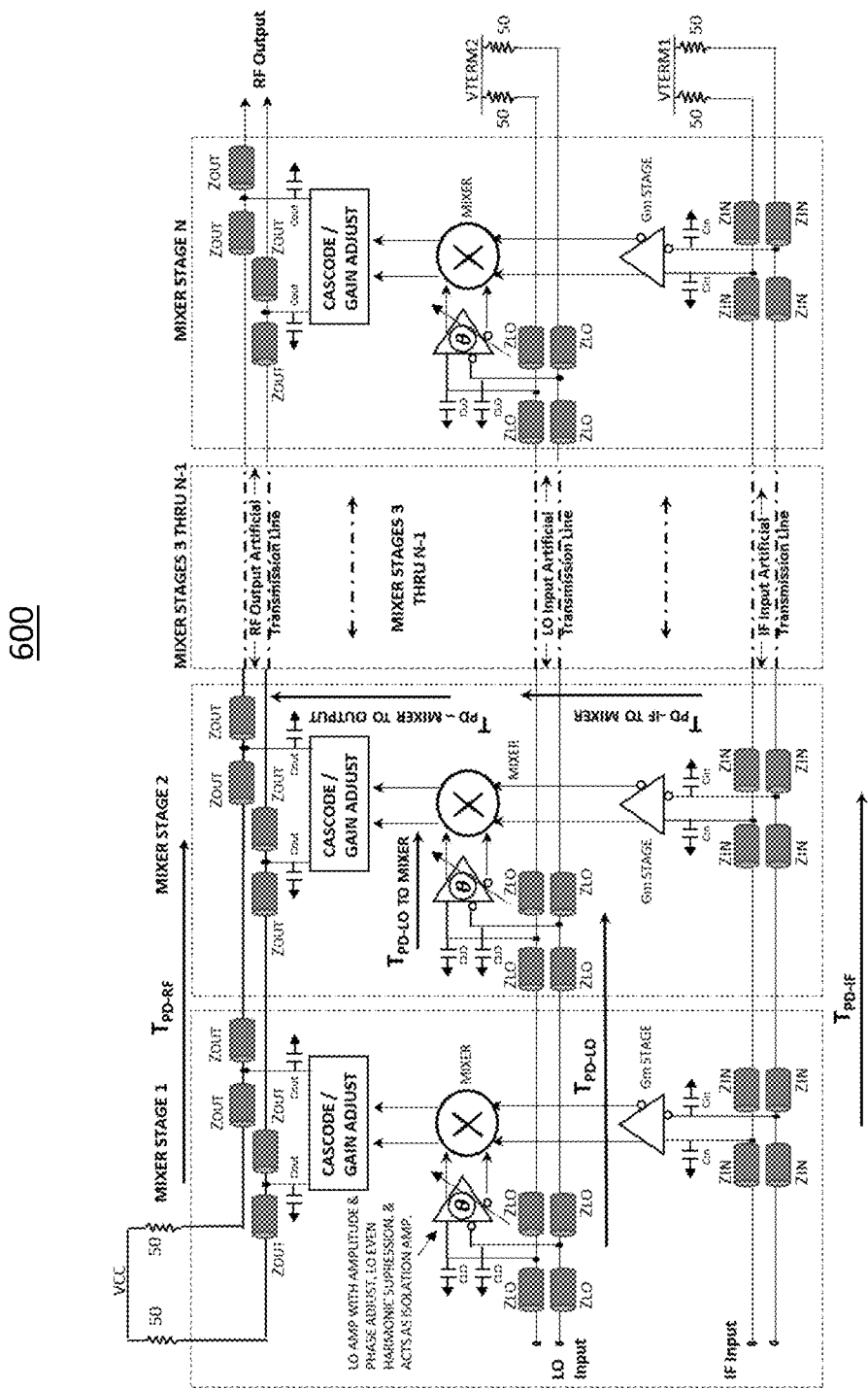
FIGS. 6, 7, 8 and 9 are TWMs according to other embodiments of the inventive concepts, respectively.

FIG. 6 is a circuit diagram showing a TWM 600 according to another embodiment of the inventive concepts.

That is, in the embodiment of FIGS. 3A and 3B, the artificial transmission lines are implemented with inductors L1, L2 and L3. FIG. 6 illustrates an alternative in which the artificial transmission lines are implemented with high impedance sections of transmission lines to compensate for parasitic capacitances. Otherwise, the embodiment of FIG. 6 is the same as that of FIGS. 3A and 3B, and thus further explanation is omitted here to avoid redundancy.

Figure 7:
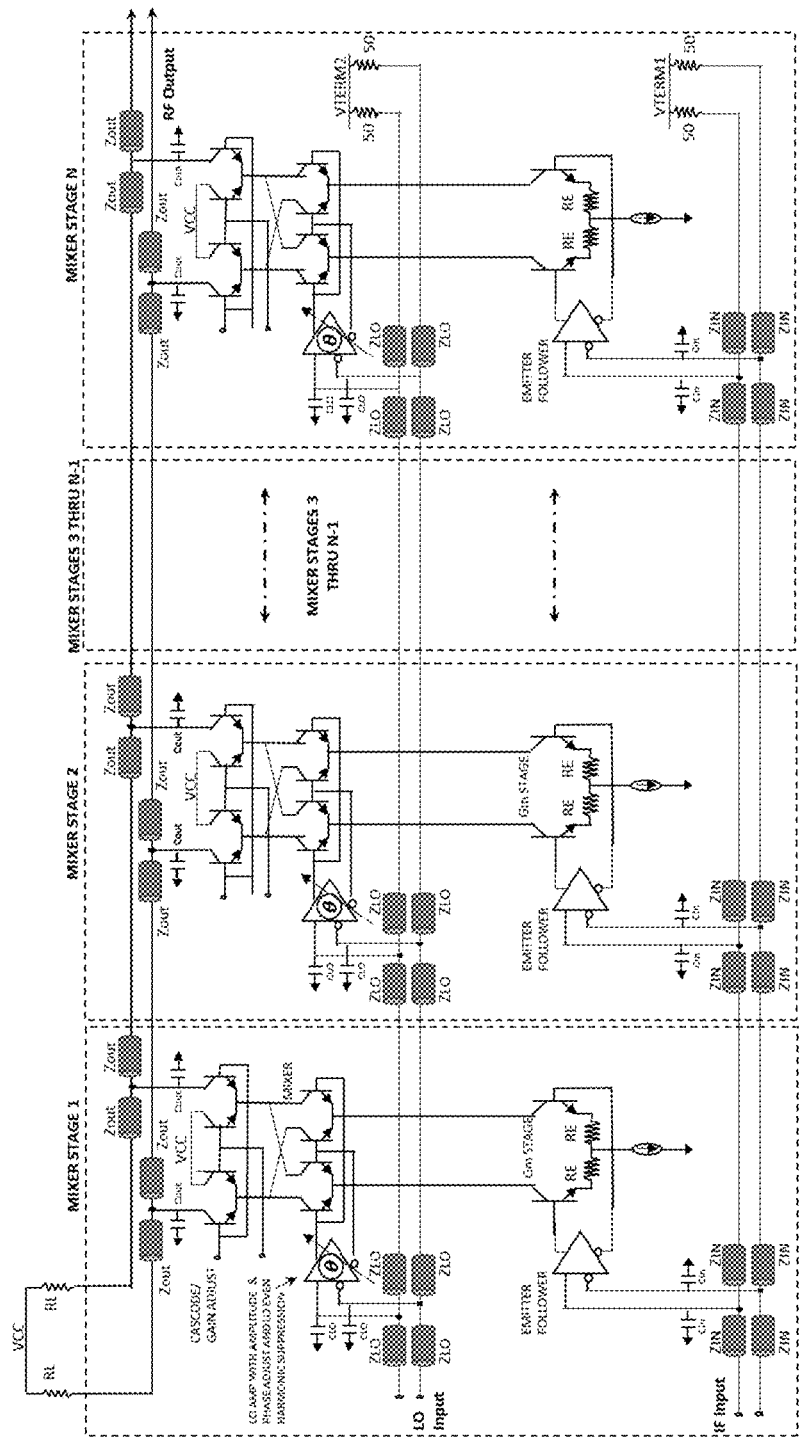

FIG. 7 is a circuit diagram showing a TWM 700 according to another embodiment of the inventive concepts.

That is, as mentioned above, the mixers of each stage may Gilbert Cell based mixers such as that shown in FIG. 1A previously discussed. FIG. 6 illustrates the TWM of FIGS. 3A and 3B with transistor level topology of the input amplifier, the mixer and the output amplifier. Otherwise, the embodiment of FIG. 6 is the same as that of FIGS. 3A and 3B, and thus further explanation is omitted here to avoid redundancy.

Figure 8:
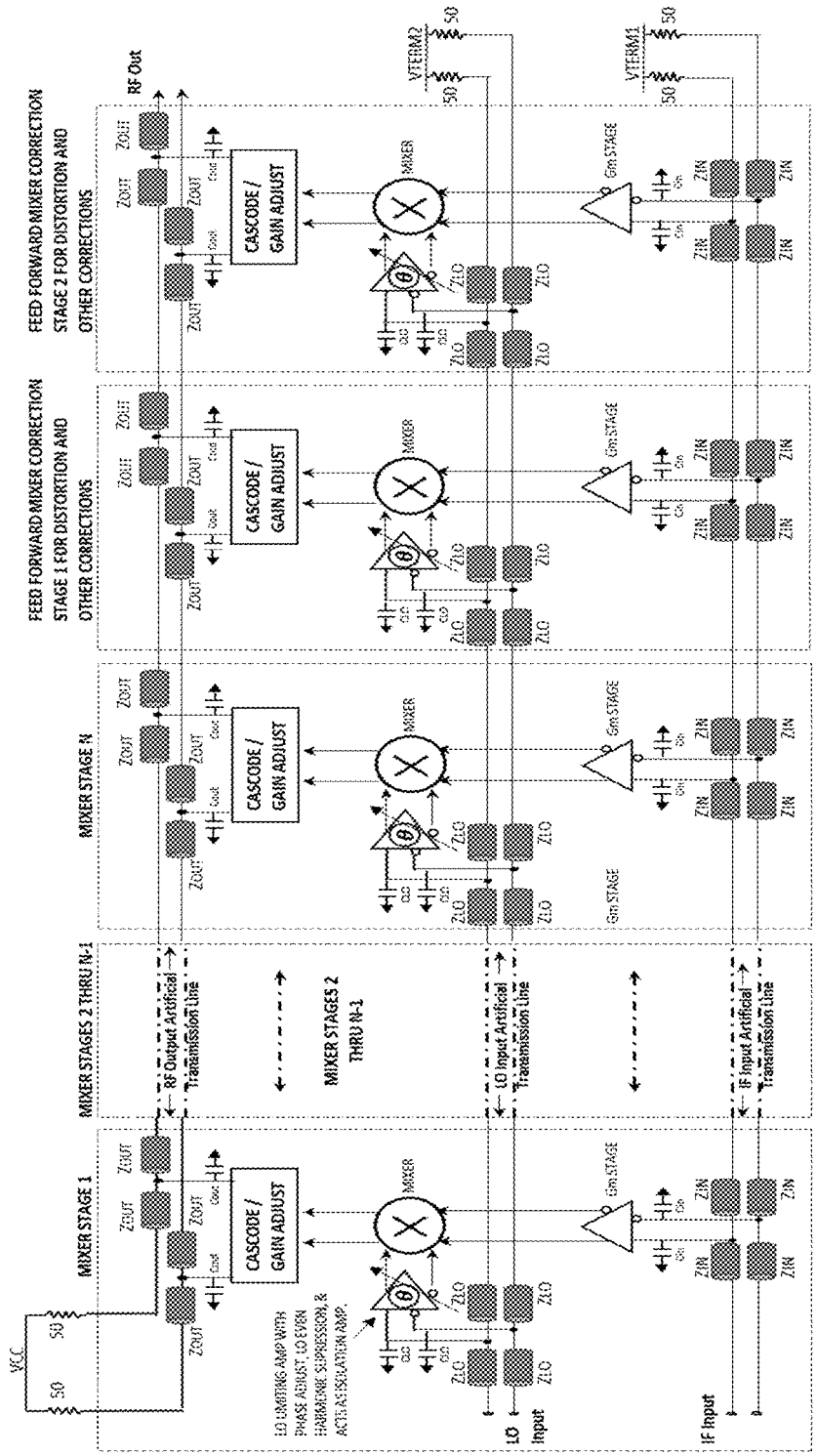

FIG. 8 is a circuit diagram showing a TWM 800 according to another embodiment of the inventive concepts.

The TWM topology of the inventive concepts allows for analog impairment corrections with correction mixers in parallel for feed forward correction. That is, the TWM topology with phase adjust also allows mixer stages to be added in parallel with the primary mixer stages for analog impairment corrections such as distortion correction, LO Even Harmonic suppression, LO Feed through, and IF Feed through by using Feed Forward Correction technique. FIG. 8 shows an example of TWM with feed forward correction. In feed forward correction, a correction mixer is added in parallel with the mixer stages. The same IF and LO inputs are applied to the main mixers and correction mixer. The output of the correction mixer generates the error signal (such as the distortion signal, LO even harmonics, LO feed thru signal, IF feed thru signal) that is added 180-degrees output of phase with the other mixer stages to cancel the unwanted mixer spurs generated by the mixer stages. LO Amplifier with phase adjust in the Mixer correction stages plays a critical role to correct the phase of the error terms so that these add 180-degrees out of phase with the unwanted terms that need to be cancelled. This TWM topology with phase adjustment in the LO Amplifier per stage is thus very critical in achieving high gain and high dynamic range over a large bandwidth.

Figure 9:
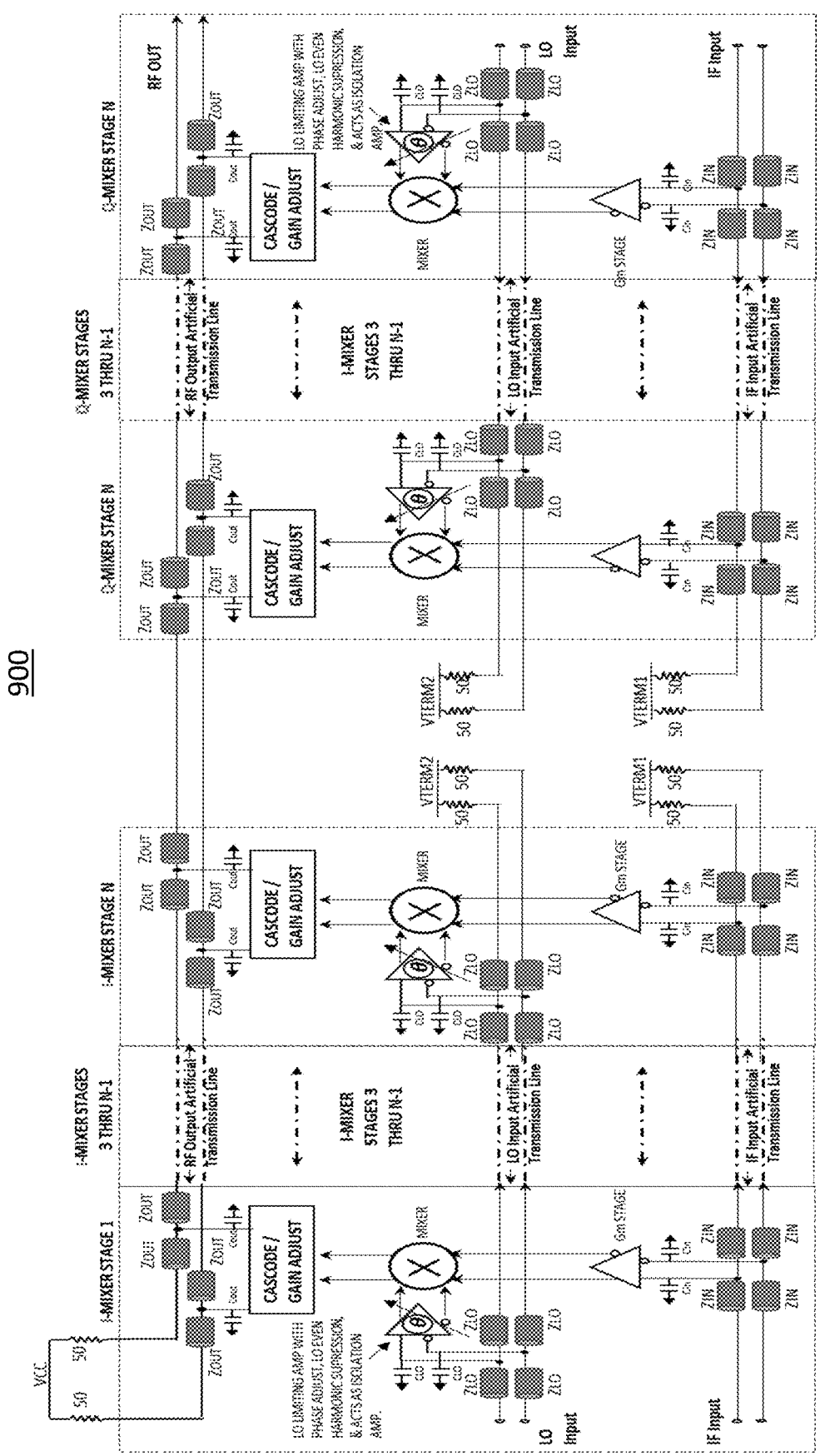

FIG. 9 is a circuit diagram showing a TWM 900 according to another embodiment of the inventive concepts.

The TWM topology of the inventive concepts allows for the implementation of IQ mixers as well. An example of this is shown in FIG. 9 in which first and second input artificial transmission lines are each configured to transmit an input signal, an output artificial transmission line configured to transmit an output signal, first and second local oscillator (LO) artificial transmission lines are each configured to transmit an LO signal, a first plurality of mixer stages are connected in parallel between the artificial output transmission line and the first input artificial transmission line, and a second plurality of mixer stages are connected in parallel between the artificial output transmission line and the second input artificial transmission line. Each of the mixer stages is configured as in the previously described embodiments. IQ mixers are used to up-convert/down-convert signals with very wide modulation bandwidths. IQ Mixers can also be used as single sideband generators or image rejection mixers. Here, it is noted that LO phase adjust is a critical feature to correct the phase mismatch of the quadrature LO signals delivered to the I-Mixer stages (0-deg LO) and Q-Mixer stages (90-deg LO) to maintain a high sideband suppression or image rejection.

As described next, the TWM of the embodiments described above overcome a number of drawbacks associated with conventional mixers and IQ-mixers.

The design includes an LO amplifier circuit with phase adjustment in each mixer stage to drive the LO signal into the transistors inside the mixer, which allows for High Gain, Low Noise, And Improved Linearity To Frequencies Above, for example, 100 GHz. The LO amplifier may also include an analog input to correct the duty cycle of the LO to 50% so that even harmonics of the LO (2LO, 4LO, etc.,) can be suppressed and this helps in suppression of unwanted mixer products generated from even harmonics of the LO mixing with the IF input (2LO+/−IF, 2LO+/−2IF, 4LO+/−IF etc.,).

The TWM of the embodiment exhibits a lower noise up to a higher frequency than a traditional Gilbert Cell mixer and the TWM mixer in the '499 patent. The lower noise is due to two reasons: First the parallel mixer stages provide higher gain and hence lower noise. Second, the LO Amplifier in each mixer stage is optimized to drive the LO into the mixer transistors with high bandwidth/high slew rate and hence turn the mixer transistors on/off at a faster rate so that the time spent by the transistors in the "on" or linear region where the noise contribution is the highest is minimized. Hence the noise performance is improved. A low Noise figure is a critical parameter to increase the dynamic range or SNR of the mixer.

The TWM of the embodiments exhibits higher linearity (lower distortion) up to a higher frequency compared to a traditional Gilbert Cell mixer and the TWM mixer of the '499 patent. First, the linearity is better to a higher frequency than a traditional Gilbert Cell Mixer because each mixer stage may be optimized for optimum gain and linearity to a high frequency. Traditional single stage Gilbert Cell mixers cannot achieve high gain and linearity to high frequencies as a TWM due to parasitic capacitances that limit the bandwidth. Second, the linearity of this TWM is better than the linearity of the TWM in the '499 patent because the LO Amplifier in each mixer stage is optimized to drive the LO with a high bandwidth or very high slew rate which improves linearity of the switching mixer transistors. The linearity of the mixers is significantly improved if the mixer transistors are turned on and off with an LO signal that has a very fast rise and fall times (or a very high slew rate). The higher slew rate on LO signal allows the mixer transistors to be turned on & off at a fast rate in the presence of large signals at the input of the mixer transistors.

Phase mismatch correction in the LO amplifier relaxes the requirement to match the Zo and group delay along the IF input, LO input, and RF output transmission lines. The phase adjust capability in the LO Amp in each mixer stage allows the phase of each mixer stage to be corrected independently. The LO phase adjust feature relaxes the requirement to match the transmission line impedance Zo and propagation delay by the amount of phase adjustment in each stage. One critical aspect of a TWM design is to match the impedance and the propagation delay of the IF input, LO input, and RF output transmission lines so that the output of each mixer stage adds in phase at the RF output. A mismatch in the impedance and the group delay of these transmission lines results in a reduction in bandwidth since the mixer outputs do not add in phase. A TWM that does not have phase adjust capability must meet the following design conditions to achieve maximum bandwidth.

1. Impedance Z of IF input, LO input, and RF output transmission lines must be equal (typically 50-ohms). Transmission line impedance Z is given by $Z=\sqrt{L/C}$, where L and C are the inductance and capacitance per unit length of the line.
2. Propagation delay of the IF input ($T_{PD\text{-}IF}$), LO input ($T_{PD\text{-}LO}$), and RF output ($T_{PD\text{-}RF}$) transmission lines must be equal from one mixer stage to the next so that the output of all stages sum in phase. Any mismatch in the propagation delay between these three transmission lines will result in a reduction in gain and bandwidth. The propagation delay along the transmission lines is given by $T_{PD}=\sqrt{LC}$, where L is the inductance of the line per stage and C is the capacitance of the circuit per stage that is compensated by the inductance of the line to get a 50-ohm impedance.

3. Propagation delay (phase delay) from IF input to mixer input ($T_{PD\text{-}IF\ TO\ MIXER}$), LO input to Mixer ($T_{PD\text{-}LO\ TO\ MIXER}$), and Mixer to RF output ($T_{PD\text{-}MIXER\ TO\ RF\ OUTPUT}$) through the transistor circuits must be the same for every stage (see FIGS. 3A and 3B). This can be a problem in TWMs with a large number of mixer stages where device mismatch between the stages over a large area can result in phase delay mismatches from input to output between the stages. Second, the phase delay mismatch is a bigger issue in TWMs with adjustable gain in which the mixer stages are designed to have different gain settings (with different device sizes and bias currents) and each stage can be turned on or off to adjust the gain of the TWM. The capacitance presented to the IF input, LO input, and RF output by these stages will be different and will be hard to match with the same propagation delay per stage and from the input to the output for each stage.

It is noted that requirements 1 and 2 above mean that inductance L and capacitance C per unit length for the IF input, LO input, and RF output transmission lines must be equal for a TWM that does not have LO phase adjust capability. This becomes a difficult design challenge given that the capacitance presented by the circuits on to these three transmission lines are different (since the three transmission lines connect to different nodes in these circuits) and given the constraints of available metal layers and other circuit components that are in close proximity to these transmission lines. Not meeting the above criteria results in a loss of bandwidth at the high frequencies.

However, the phase adjust capability in the LO Amp in each mixer stage allows the phase of each mixer stage to be corrected independently. This has a couple of benefits. First it allows the impedance and hence propagation delay match requirements to be relaxed for the IF input, LO input, and RF output transmission lines. Second, it easily allows correction of phase mismatch between the mixer stages due to process mismatch during fabrication or due to intentional mismatch in mixer stages such as in a TWM with adjustable gain as described above. The phase correction capability is especially important at frequencies above 100 GHz at which small amounts of phase mismatch between mixer stages can result in reduction in gain and bandwidth.

It is important to note that the delay mismatches between parallel mixer stages in the LO signal path can be cancelled completely by phase adjustment in each stage. This is because time delay mismatches in the LO signal path result in a fixed phase mismatch for all frequencies at the output of each mixer stage. The phase mismatches in the IF input and RF output signal path between mixer stages can be reduced by half for upper or lower side band by adjusting the phase of the LO in each mixer. This is because a fixed time delay mismatch in the IF and RF outputs between mixer stages introduces a phase error that increases linearly with frequency for IF and RF signals. This phase error in IF and RF signals paths can only be reduced by half.

Self-Mixing occurs when IF input or RF output signals couple into the LO input of the mixer and mix with the input IF signal thus creating un-wanted spurs on the mixer output. The IF input to LO and RF output to LO coupling increases with several mixer stages in parallel, thus making the self-mixing problem worse. The LO Amplifier in each mixer provides isolation between the IF input to LO input transmission line and RF output to LO input transmission line, thus minimizing self-mixing between input and output signals.

As discussed previously in connection with FIG. 9, IQ Mixers can be implemented with the TWM topology of the embodiments.

Each IF input Gm stage in the mixer may have an analog control input to suppress the LO feed thru to the RF output. The LO feed thru occurs due to dc errors in the IF input stage. The dc in the IF mixes with the LO signal causing the LO feed through at the output. The analog input corrects the dc offset error in each IF input stage thus suppressing the LO feed through.

The cascode transistors may be used above the Gilbert transistors to reduce the capacitance looking into the input of the Gilbert Cell transistors due to Miller Capacitance effect as explained in the previous section. The cascode transistors help to improve the bandwidth significantly.

While the disclosure references exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A travelling wave mixer (TWM), comprising:
an input artificial transmission line configured to transmit an input signal;
an output artificial transmission line configured to transmit an output signal;
a local oscillator (LO) artificial transmission line configured to transmit an LO signal; and
a plurality of mixer stages connected in parallel between the output artificial transmission and the input artificial transmission line;
wherein each of the mixer stages comprises an input amplifier, a mixer and an output amplifier connected in series between the input artificial transmission line and the output artificial transmission line, where an input of the mixer receives an output of the input amplifier, and an output of the mixer is applied to an input of the output amplifier, and
wherein each of the mixer stages further comprises a phase-adjustable LO amplifier circuit connected between the LO artificial transmission line and an LO input of the mixer, the phase-adjustable LO amplifier configured to adjust an LO signal phase applied to the LO input of each mixer to null out a phase error in each mixer stage independently.

2. The TWM of claim 1, wherein the phase error in each mixer stage nulled out by the phase-adjustable LO amplifier is a phase error in the signal path from the LO artificial transmission line to the output of the mixer in each stage.

3. The TWM of claim 1, wherein the phase error in each mixer stage nulled out by the phase-adjustable LO amplifier is a phase error of an upper side band signal or a lower side band signal at the output of the mixer in each stage.

4. The TWM of claim 1, wherein the input signal comprises a range of frequencies, and the phase error in each mixer stage nulled out by the phase-adjustable LO amplifier is one half a difference between a maximum phase error and a minimum phase error in an upper side band signal or a lower side band signal at the output of the mixer in each stage.

5. The TWM of claim 1, wherein the phase-adjustable LO amplifier is configured to adjust a duty cycle of the LO signal applied to the LO input of the mixer.

6. The TWM of claim 5, where the duty cycle is adjusted to 50%.

7. The TWM of claim 1, wherein the phase-adjustable LO amplifier functions as an isolation element which inhibits input and output signals of the mixer of each mixer stage from coupling back to the LO artificial transmission line.

8. The TWM of claim 7, wherein the phase-adjustable LO amplifier functions to minimize a capacitance on the LO artificial transmission line and maximize a voltage swing delivered to the mixer of each mixer stage.

9. The TWM of claim 1, wherein the input amplifier of each mixer stage is a transconductance amplifier.

10. The TWM of claim 9, wherein the output amplifier of each mixer stage is a cascode amplifier.

11. The TWM of claim 1, wherein the input, output and LO artificial transmission lines are implemented with inductors.

12. The TWM of claim 1, wherein the input, output and LO artificial transmission lines are implemented with high-impedance transmission line sections.

13. The TWM of claim 1, further comprising at least one feed forward mixer correction stage connected in parallel between the input transmission line and the output transmission line.

14. The TWM of claim 12, wherein each feed forward mixer correction stage comprises an amplifier and a mixer connected in series between the input transmission line and the output transmission line, where an input of the mixer receives an output of the input amplifier, and an output of the mixer is applied to an input of the output amplifier, and
wherein each feed forward mixer correction stage further comprises a phase-adjustable LO amplifier circuit connected between the LO transmission line and an LO input of the mixer, the phase-adjustable LO amplifier configured to adjust an LO signal phase applied to the LO input of each mixer to null out a phase error in each feed forward mixer correction stage independently.

15. The TWM of claim 1, further comprising at least analog impairment correction stage connected in parallel between the input transmission line and the output transmission line.

16. The TWM of claim 12, wherein each analog impairment correction stage comprises an input amplifier, a mixer and an output amplifier connected in series between the input transmission line and the output transmission line, where an input of the mixer receives an output of the amplifier, and an output of the mixer is applied to an input of the output amplifier, and
wherein each feed forward mixer correction stage further comprises a phase-adjustable LO amplifier circuit connected between the LO transmission line and an LO input of the mixer, the phase-adjustable LO amplifier configured to adjust an LO signal phase applied to the LO input of each mixer to null out a phase error in each feed forward mixer correction stage independently.

17. A travelling wave IQ-mixer (TWM-IQ), comprising:
first and second input artificial transmission lines each configured to transmit an input signal;
an output artificial transmission line configured to transmit an output signal;
first and second local oscillator (LO) artificial transmission line each configured to transmit an LO signal;
a first plurality of mixer stages connected in parallel between the artificial output transmission line and the first input artificial transmission line; and
a second plurality of mixer stages connected in parallel between the artificial output transmission line and the second input artificial transmission line;
wherein each of the first mixer stages comprises an input amplifier, a mixer and an output amplifier connected in series between the first input artificial transmission line and the output artificial transmission line, where an input of the mixer receives an output of the amplifier, and an output of the mixer is applied to an input of the output amplifier,
wherein each of the first mixer stages further comprises a phase-adjustable LO amplifier circuit connected between the first LO artificial transmission line and an LO input of the mixer, the phase-adjustable LO amplifier configured to adjust an LO signal phase applied to the LO input of each mixer to null out a phase error in each first mixer stage independently,
wherein each of the second mixer stages comprises an input amplifier, a mixer and an output amplifier connected in series between the second input artificial transmission line and the output artificial transmission line, where an input of the mixer receives an output of the input amplifier, and an output of the mixer is applied to an input of the output amplifier, and
wherein each of the second mixer stages further comprises a phase-adjustable LO amplifier circuit connected between the second LO artificial transmission line and an LO input of the mixer, the phase-adjustable LO amplifier configured to adjust an LO signal phase applied to the LO input of each mixer to null out a phase error in each second mixer stage independently.

18. The TWM of claim 17, wherein the phase error in each mixer stage nulled out by the phase-adjustable LO amplifier is a phase error in the signal path from the LO artificial transmission line to the output of the mixer in each stage.

19. The TWM of claim 17, wherein the phase error in each mixer stage nulled out by the phase-adjustable LO amplifier is a phase error of an upper side band signal or a lower side band signal at the output of the mixer in each stage.

20. The TWM of claim 17, wherein the input signal comprises a range of frequencies, and the phase error in each mixer stage nulled out by the phase-adjustable LO amplifier is one half a difference between a maximum phase error and a minimum phase error in an upper side band signal or a lower side band signal at the output of the mixer in each stage.

* * * * *